(12) United States Patent
Tomimoto (10) Patent No.: US 12,376,249 B2
(45) Date of Patent: Jul. 29, 2025

(54) ELECTRONIC DEVICE AND GASKET (71) Applicant: PATLITE CORPORATION, Osaka (JP)

(72) Inventor: Masao Tomimoto, Osaka (JP)

(73) Assignee: PATLITE CORPORATION, Osaka (JP)

( * ) Notice: Subject to any disclaimer, the term of this patent is extended or adjusted under 35 U.S.C. 154(b) by 0 days.

(21) Appl. No.: 18/548,149

(22) PCT Filed: Feb. 28, 2022

(86) PCT No.: PCT/JP2022/008406
§ 371 (c)(1),
(2) Date: Aug. 28, 2023

(87) PCT Pub. No.: WO2023/162265
PCT Pub. Date: Aug. 31, 2023

(65) Prior Publication Data
US 2025/0024619 A1    Jan. 16, 2025

(51) Int. Cl.
*G06F 1/16* (2006.01)
*F21V 31/00* (2006.01)
(Continued)

(52) U.S. Cl.
CPC ........... *H05K 5/061* (2013.01); *F21V 31/005* (2013.01)

(58) Field of Classification Search
CPC .......... H05K 5/061; H05K 5/06; H05K 5/062; H05K 5/063; H05K 5/064; H05K 5/065;
(Continued)

(56) References Cited

U.S. PATENT DOCUMENTS

| | | | |
|---|---|---|---|
| 12,212,008 B2 * | 1/2025 | Hirano | H01M 50/152 |
| 12,272,829 B2 * | 4/2025 | Kohira | H01M 50/152 |

(Continued)

FOREIGN PATENT DOCUMENTS

| | | |
|---|---|---|
| CN | 105472951 A | 4/2016 |
| JP | 2001152472 A | 6/2001 |

(Continued)

OTHER PUBLICATIONS

"X Ring", [online], [searched on Feb. 18, 2022], Internet <URL: https://www.sakura-seal.co.jp/category/1978440.html>.

(Continued)

*Primary Examiner* — Anthony M Haughton
(74) *Attorney, Agent, or Firm* — Rabin & Berdo. P.C.

(57) ABSTRACT

An electronic device of the present invention includes: a stacked body including at least one columnar stacked unit that is stacked in a first direction and accommodates an electronic component; a lid member attached to an end-portion stacked unit provided at an end portion in the first direction of the stacked unit, and having a top wall portion and a side wall portion extending from a peripheral edge of the top wall portion; and a ring-shaped gasket attached between the end-portion stacked unit and the lid member, in which a ring-shaped attachment groove for accommodating the gasket is formed on an outer peripheral surface of the end-portion stacked unit, the attachment groove has a first surface on the lid member side in the first direction, a second surface on a side opposite to the first surface in the first direction.

6 Claims, 10 Drawing Sheets

(51) Int. Cl.
    *H05K 5/00*    (2025.01)
    *H05K 5/06*    (2006.01)
    *H05K 7/00*    (2006.01)
(58) Field of Classification Search
    CPC ........ H05K 5/066; H05K 5/067; H05K 5/068;
                H05K 5/069; F21V 31/005; F21V 31/00
    See application file for complete search history.

(56) References Cited

U.S. PATENT DOCUMENTS

| | | |
|---|---|---|
| 2008/0290612 A1 | 11/2008 | Imai et al. |
| 2015/0323142 A1 | 11/2015 | Shigematsu |
| 2018/0106467 A1 | 4/2018 | Mashiro |
| 2018/0192526 A1 | 7/2018 | Suzuki et al. |
| 2019/0267583 A1* | 8/2019 | Masumoto .......... H01M 50/169 |
| 2020/0083494 A1* | 3/2020 | Bae .................... H01M 50/152 |
| 2020/0365839 A1* | 11/2020 | Kim .................. H01M 10/0422 |
| 2021/0175566 A1* | 6/2021 | Okutani .............. H01M 50/166 |
| 2022/0085442 A1* | 3/2022 | Hirano ................ H01M 50/184 |
| 2023/0044229 A1* | 2/2023 | Lin .................... H01M 50/169 |

FOREIGN PATENT DOCUMENTS

| | | |
|---|---|---|
| JP | 2004204925 A | 7/2004 |
| JP | 2007092729 A | 4/2007 |
| JP | 2008181896 A | 8/2008 |
| JP | 2015197176 A | 11/2015 |
| JP | 5967458 B2 | 8/2016 |
| JP | 2018046030 A | 3/2018 |
| WO | 2005121612 A1 | 12/2005 |
| WO | 2015049751 A1 | 4/2015 |
| WO | 2017115428 A1 | 7/2017 |
| WO | 2020090047 A1 | 5/2020 |
| WO | 2021014497 A1 | 1/2021 |

OTHER PUBLICATIONS

International Search Report for International Application No. PCT/JP2022/008406, issued on May 17, 2022.
Written Opinion for International Application No. PCT/JP2022/008406, issued on May 17, 2022.
European Search Report dated Sep. 26, 2024, in the counterpart European Patent Application No. 22926356.1.
Japanese Office Action dated Sep. 3, 2024, in the counterpart Japanese patent application No. 2023-532716.
Korean Office Action dated Mar. 13, 2025, in the counterpart Korean Patent Application No. 10-2023-7023698.

* cited by examiner

ELECTRONIC DEVICE AND GASKET

TECHNICAL FIELD

The present invention relates to an electronic device that requires water-stopping performance, and a gasket.

BACKGROUND ART

Non-Patent Literature 1 discloses a gasket called an X-ring. This gasket has an X-shaped cross section, and the cross section is configured such that four protrusions protrude at approximately 90-degree intervals. When this gasket is disposed between two members that require water-stopping performance, the four protrusions apply equal contact pressure and stress to the gasket in the up-down direction and the left-right direction, and therefore high water-stopping performance is exhibited.

CITATION LIST

Patent Literature

Non-Patent Literature 1: "X Ring", [online], [searched on Feb. 18, 2022], Internet <URL: https://www.sakura-seal-.co.jp/category/1978440.html>

SUMMARY OF INVENTION

Technical Problem

However, since the above-described gasket has a recess formed between adjacent protrusions, there is a problem in that it is not stably held between the two members. For example, when removing or attaching two members, the frictional resistance between the gasket and either member may cause the gasket to twist, which can cause the gasket to come off.

The present invention has been made to solve the foregoing problem, and aims to provide an electronic device capable of stably holding a gasket and preventing the gasket from coming off during attachment or removal, and a gasket that can be attached to the electronic device.

Solution to Problem

A first electronic device of the present invention includes: a stacked body including at least one columnar stacked unit that is stacked in a first direction and accommodates an electronic component; a lid member attached to an end-portion stacked unit provided at an end portion in the first direction of the stacked unit, and having a top wall portion and a side wall portion extending from a peripheral edge of the top wall portion; and a ring-shaped gasket attached between the end-portion stacked unit and the lid member, in which a ring-shaped attachment groove for accommodating the gasket is formed on an outer peripheral surface of the end-portion stacked unit, the attachment groove has a first surface on the lid member side in the first direction, a second surface on a side opposite to the first surface in the first direction, and a third surface extending along the first direction and connecting the first surface and the second surface, the gasket includes: a base portion extending in the first direction and having a first end portion and a second end portion; a ring-shaped first protrusion extending radially inward and outward at the first end portion of the base portion on the end-portion stacked unit side in the first direction; and at least one ring-shaped second protrusion extending radially inward and outward on the lid member side of the base portion in the first direction relative to the first protrusion, radially inner and outer end portions of the first protrusion and the second protrusion are configured to come into contact with the third surface and the side wall, respectively, and at least part of the first protrusion and the first end portion of the base portion is configured to come into contact with the second surface of the attachment groove.

A second electronic device of the present invention includes: a stacked body having two or more columnar stacked units stacked in a first direction and accommodating electronic components; and a gasket provided between the stacked units adjacent in the first direction, in which the two or more stacked units adjacent in the first direction include at least a first stacked unit arranged on one side in the first direction and a second stacked unit arranged on the other side in the first direction, a ring-shaped side wall portion extending from an end portion in an axial direction of the second stacked unit toward the first stacked unit is provided, a ring-shaped attachment groove for accommodating the gasket is formed on an outer peripheral surface of the first stacked unit, the attachment groove has a first surface on the second stacked unit side in the first direction, a second surface on a side opposite to the first surface in the first direction, and a third surface extending along the first direction and connecting the first surface and the second surface, the gasket includes: a base portion extending in the first direction and having a first end portion and a second end portion; a ring-shaped first protrusion extending radially inward and outward at the first end portion of the base portion on the stacked unit side in the first direction; and at least one ring-shaped second protrusion extending radially inward and outward on the second end portion side of the base portion with respect to the first protrusion, radially inner and outer end portions of the first protrusion and the second protrusion are configured to come into contact with the third surface and the side wall, respectively, and at least part of the first protrusion and the first end portion of the base portion is configured to come into contact with the second surface of the attachment groove.

In the above electronic devices, the length of the first protrusion in the radial direction can be longer than the length of the second protrusion in the radial direction, and a ring-shaped recess that accommodates the first protrusion of the gasket and extends radially inward can be formed on the third surface of the attachment groove.

In the above electronic devices, two or more of the second protrusions can be formed at a predetermined interval in the first direction.

In the above electronic devices, a flat surface capable of coming into contact with the second surface of the attachment groove can be formed on the second end portion of the base portion.

The gasket of the present invention has the same configuration as the gasket attached to any one of the electronic devices described above.

Advantageous Effects of Invention

According to this invention, a gasket can be stably held and the gasket can be prevented from coming off during attachment or removal.

DESCRIPTION OF EMBODIMENTS

Figure 1:
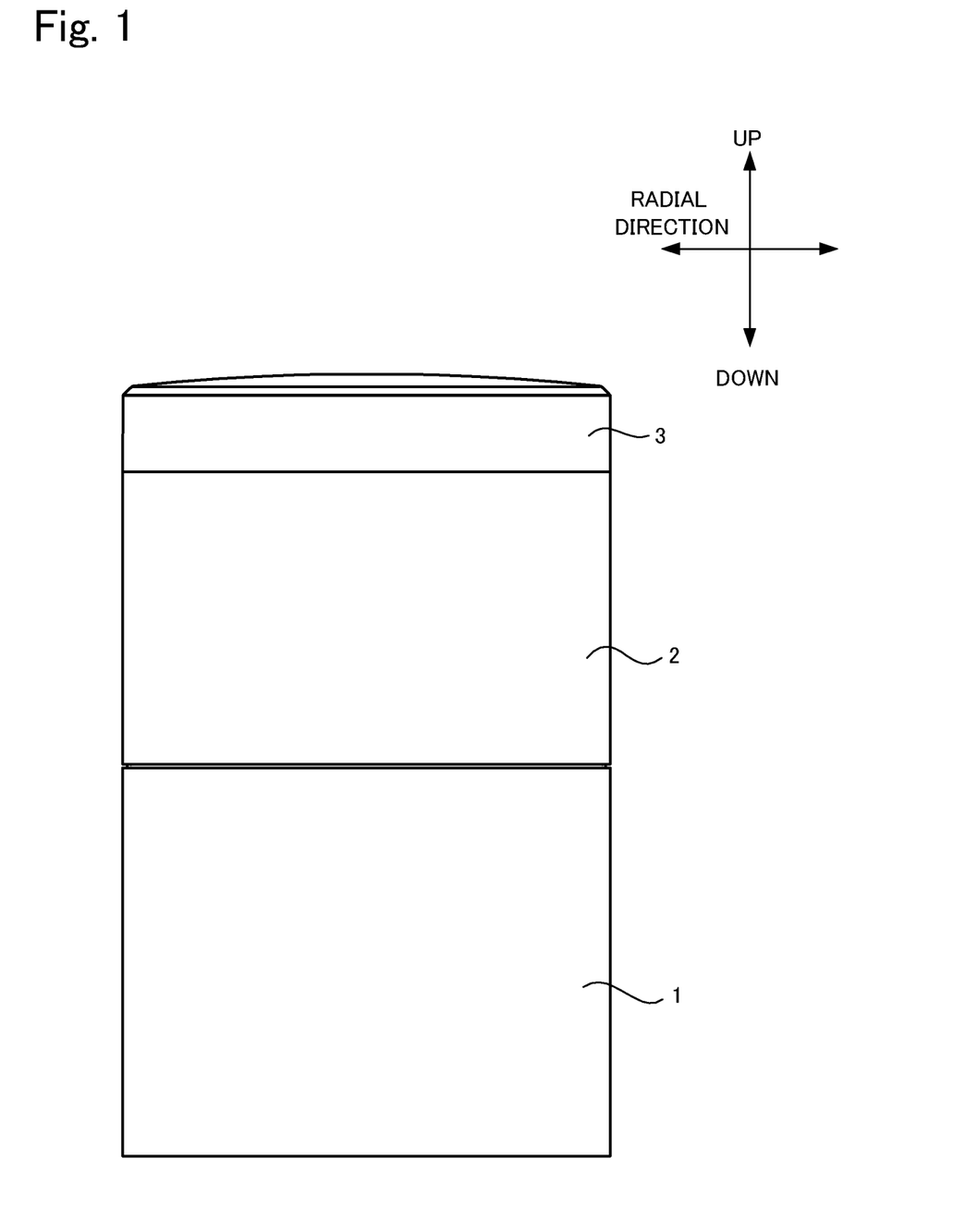
FIG. 1 is a side view of an embodiment in which an electronic device according to the present invention is applied to a signal lamp.
Figure 2:
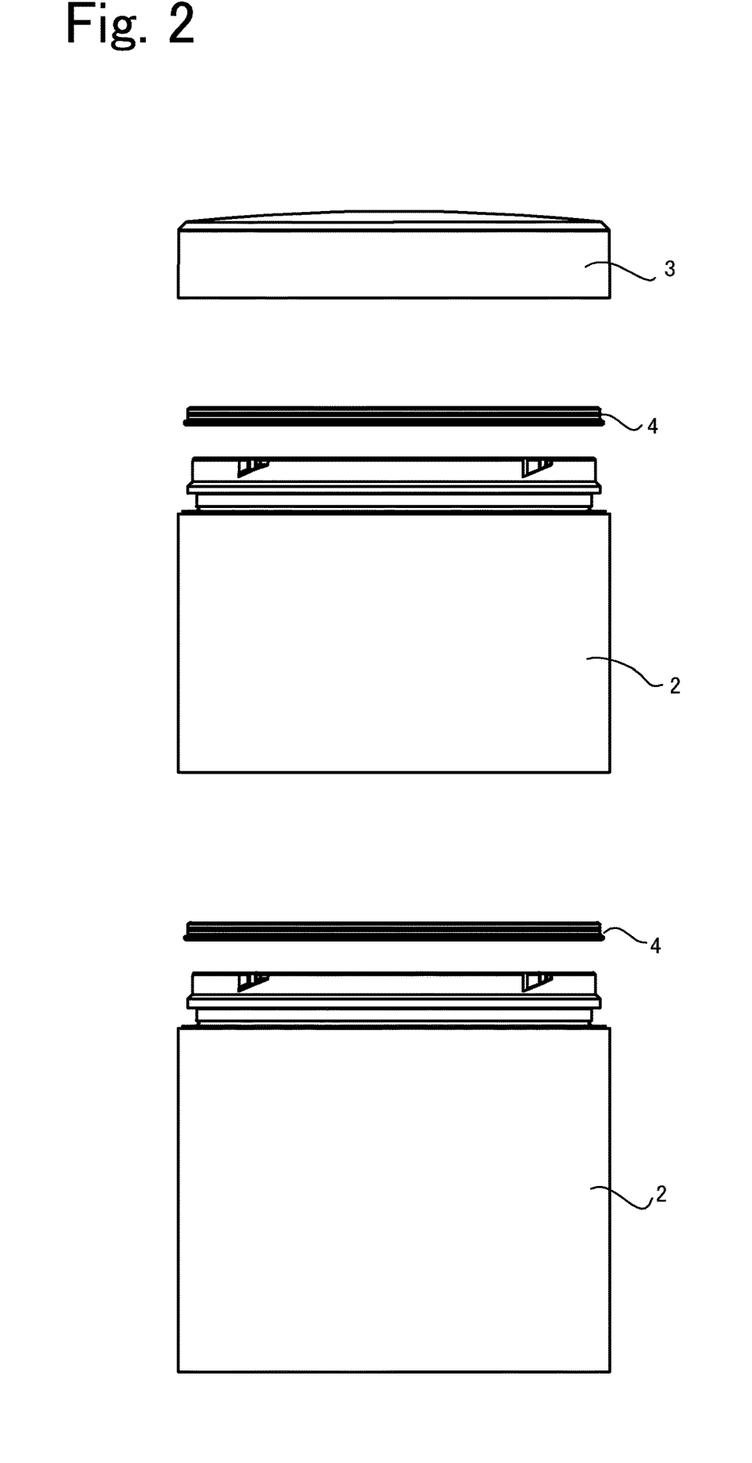
FIG. 2 is an exploded side view of the signal lamp of FIG. 1.
Figure 3:
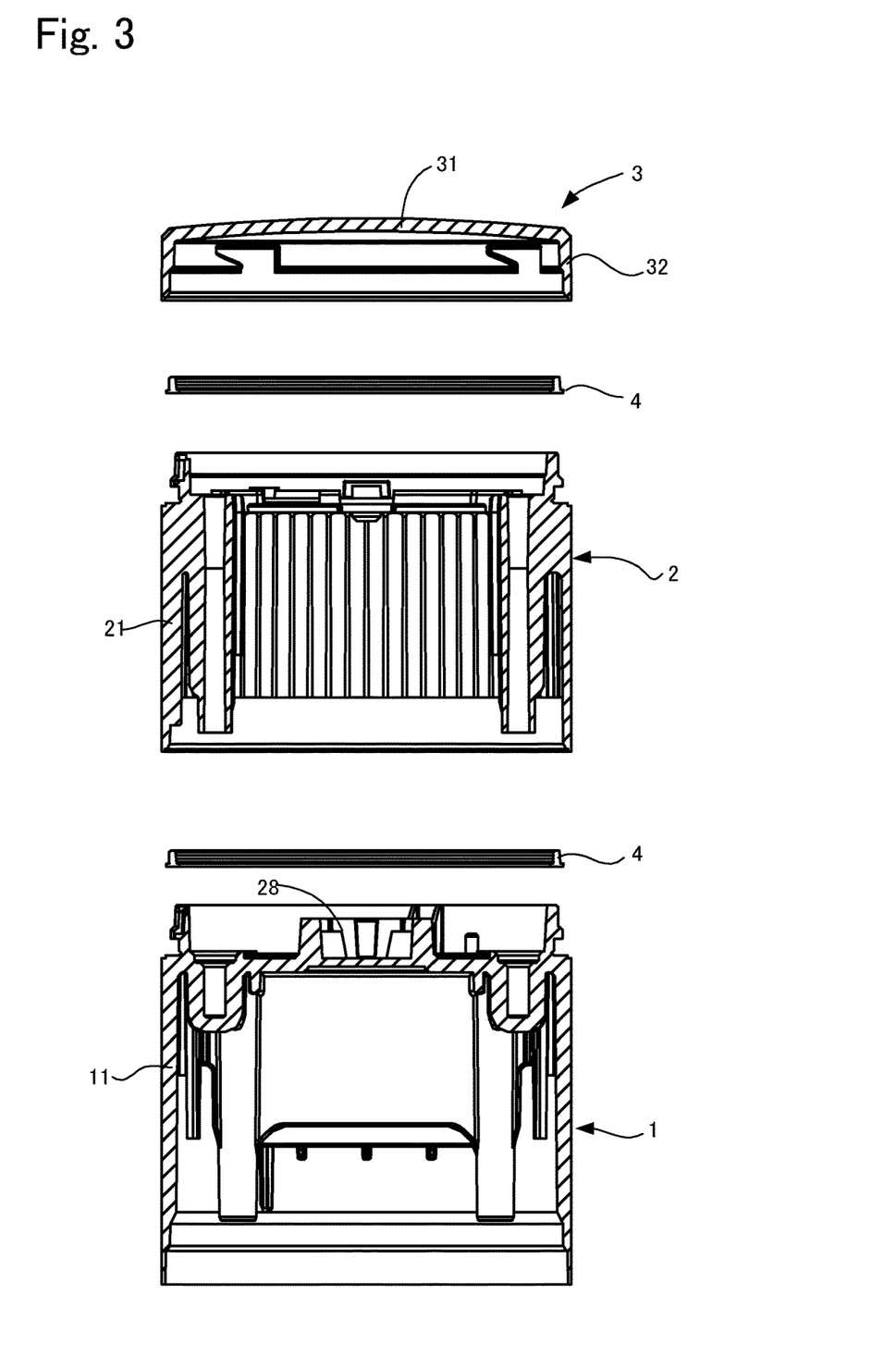
FIG. 3 is an exploded perspective view of the signal lamp of FIG. 1.
Figure 4:
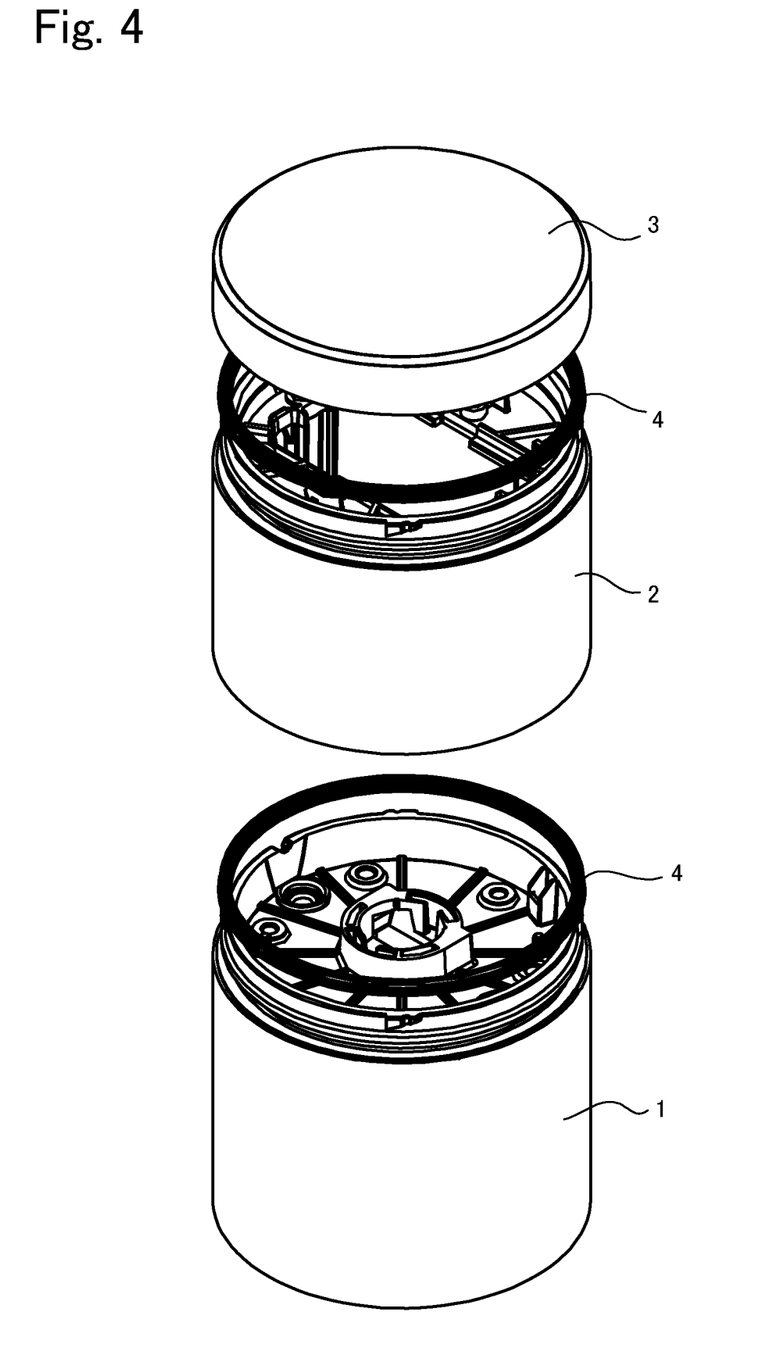
FIG. 4 is an exploded cross-sectional view of the signal lamp of FIG. 1.

An embodiment in which an electronic device according to the present invention is applied to a signal lamp will be described below with reference to the drawings. This signal lamp is attached to various devices whose states change, such as a production facility and a printer, and is configured to perform notification of a change in state with a signal. FIG. 1 is a side view of the signal lamp, FIG. 2 is an exploded side view of the signal lamp of FIG. 1, FIG. 3 is an exploded perspective view of the signal lamp of FIG. 1, and FIG. 4 is an exploded cross-sectional view of the signal lamp of FIG. 1. Although the following description will be given according to the directions shown in each drawing, the present invention can be configured without being limited to these directions.

<1. Overview of Signal Lamp>

As shown in FIGS. 1 to 4, the signal lamp according to this embodiment includes a cylindrical base unit 1, a lighting unit 2 attached to the top of the base unit 1, and a lid member 3 attached to the top of the lighting unit 2. Ring-shaped gaskets 4 are respectively provided between the base unit 1 and the lighting unit 2 and between the lighting unit 2 and the cover member 3, and these gaskets 4 prevent water or the like from entering the base unit 1 and the lighting unit 2.

The outer peripheral surface of the lighting unit 2 is constituted by a colored translucent outer wall portion 21, and the outer wall portion 21 accommodates various electronic components such as a light source such as an LED. The outer peripheral surface of the base unit 1 is constituted by a cylindrical outer wall portion 11, and inside this outer wall portion 11, various electronic components such as a controller that receives a control signal from the above-described production facility and controls lighting of the light source of the lighting unit 2 based on this control signal, and a power source are accommodated. Also, the lighting unit 2 and the base unit 1 are each provided with a connector 28 (only the connector of the base unit 1 is shown) that electrically connects the lighting unit 2 and the base unit 1 when the lighting unit 2 is attached to the base unit 1, as will be described later.

The lid member 3 has a disk-shaped top wall portion 31 and a cylindrical side wall portion 32 extending downward from the peripheral edge of the top wall portion 31. The outer peripheral surface of the upper end portion of the outer wall portion 21 of the lighting unit 2 is recessed radially inward, and the side wall portion 32 of the lid member 3 fits into this recessed portion. As a result, the outer peripheral surface of the side wall portion 32 of the lid member 3 and the outer peripheral surface of the lighting unit 2 are connected so as to be flush with each other.

Also, the lower end portion of the outer wall portion 21 of the lighting unit 2 protrudes downward. The outer peripheral surface of the upper end portion of the outer wall portion 11 of the base unit 1 is recessed radially inward, and the lower end portion of the outer wall portion 21 of the lighting unit 2 fits into this recessed portion. As a result, the outer peripheral surface of the lighting unit 2 and the outer peripheral surface of the base unit 1 are connected so as to be flush with each other.

<2. Seal Structures>

Figure 5:
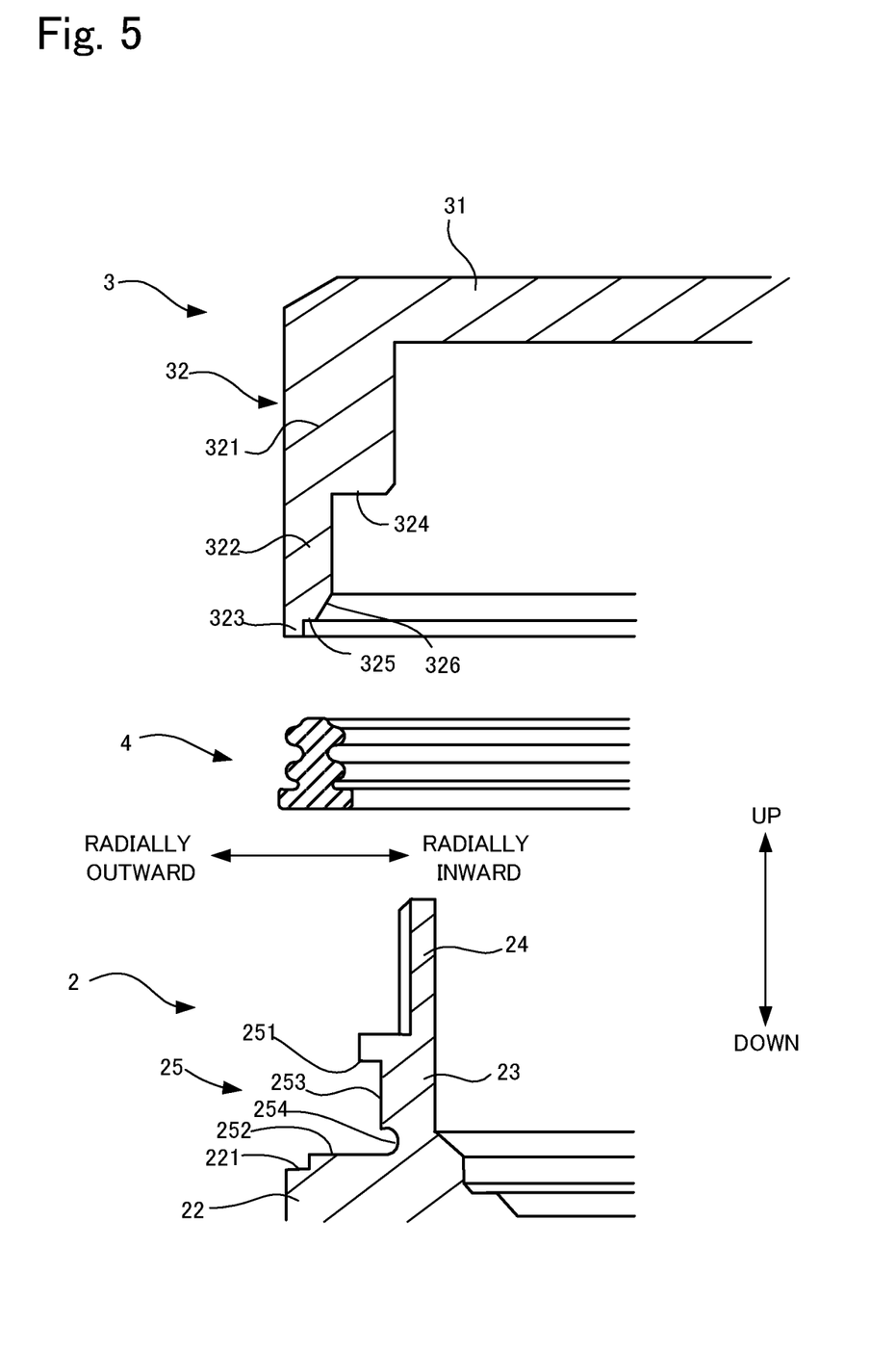
FIG. 5 is an enlarged exploded view of a seal structure.
Figure 7:
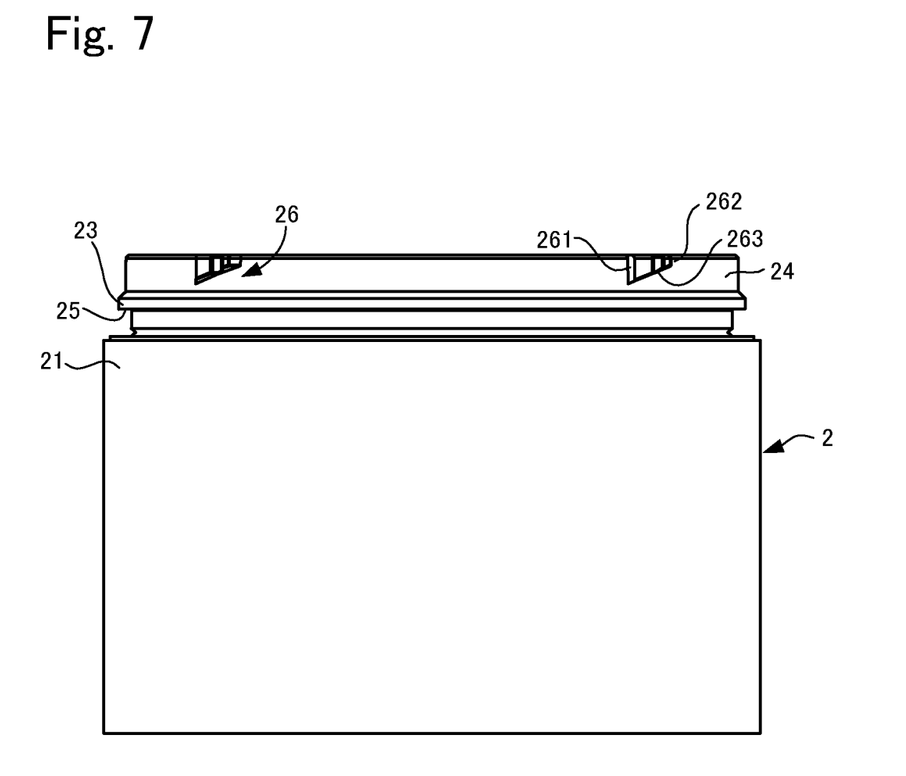
FIG. 7 is a side view of a lighting unit.
Figure 8:
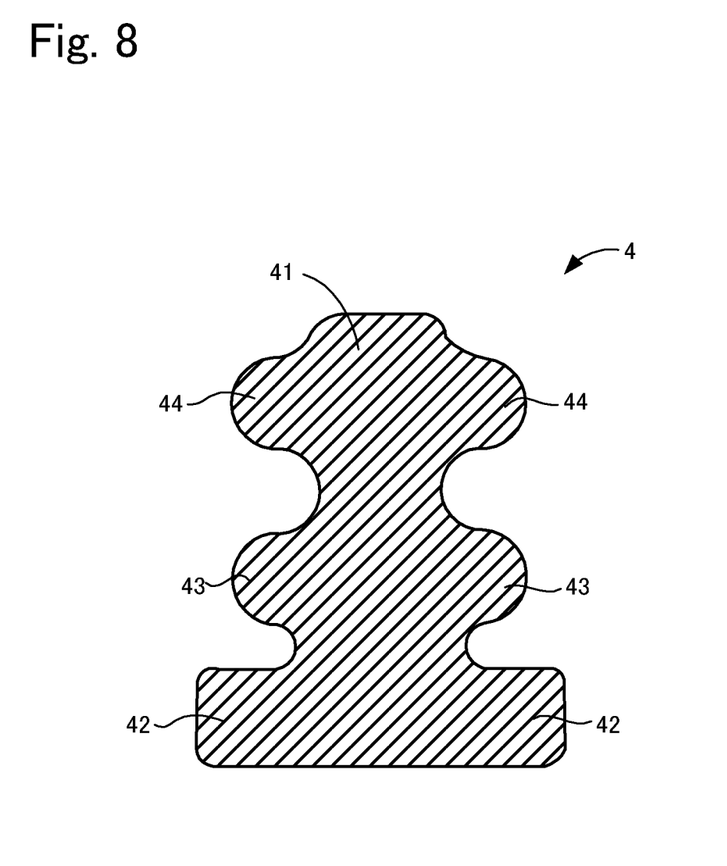
FIG. 8 is a cross-sectional view of a gasket.

Next, seal structures formed using the gaskets 4 between the base unit 1 and the lighting unit 2 and between the lighting unit 2 and the lid member 3 will be described. Since these two seal structures are approximately the same, the seal structure between the lighting unit 2 and the lid member 3 will be described below with reference to FIGS. 5 and 6. FIG. 5 is an enlarged exploded view of the seal structure, FIG. 6 is a cross-sectional view of the lid member, FIG. 7 is a side view of the lighting unit, and FIG. 8 is a cross-sectional view of the gasket.

First, the side wall portion 32 of the lid member 3 will be described. As shown in FIGS. 5 and 6, the side wall portion 32 of the lid member 3 includes a first portion 321 extending downward from the top wall portion 31, a second portion 322 extending downward from the first portion 321, and a third portion 323 extending downward from the second portion 322. As for the thicknesses of these portions 321 to 323, the thickness of the first portion 321 is the greatest, followed by the second portion 322, and then the third portion 323. In addition, the outer peripheral surfaces of the respective portions 321 to 323 are continuous with each other. Accordingly, on the inner wall surface of the side wall portion 32, a first stepped portion 324 is formed between the first portion 321 and the second portion 322, and a second stepped portion 325 is formed between the second portion 322 and the third portion 323. Also, a tapered surface 326 that extends obliquely is formed between the second stepped portion 325 and the inner wall surface of the second portion 322.

Figure 6:
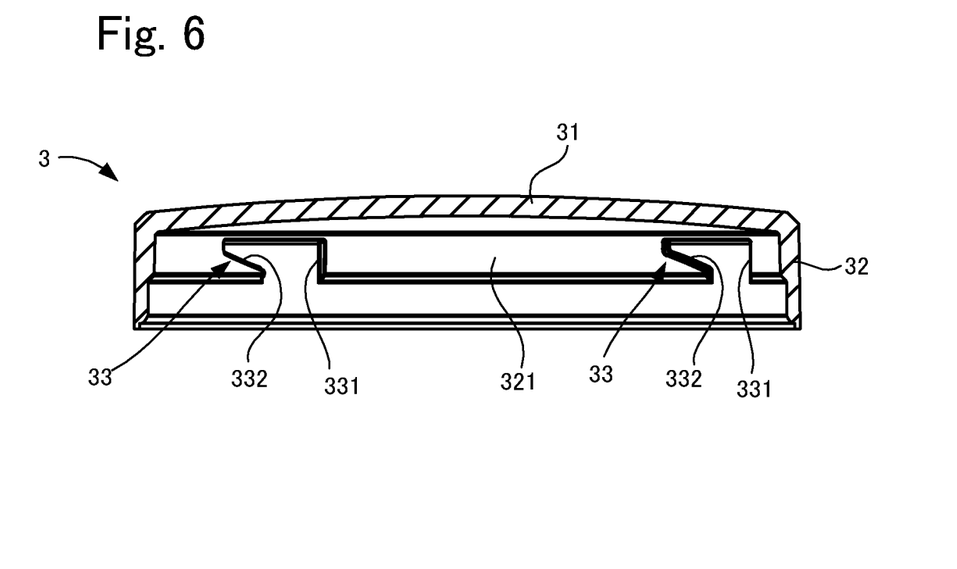
FIG. 6 is a cross-sectional view of a lid member.

As shown in FIG. 6, a plurality of recesses 33 extending upward from the first stepped portion 324 are formed at a predetermined interval in the peripheral direction on the inner wall surface of the first portion 321. In this embodiment, as an example, four recesses 33 are formed. Each recess 33 has a first edge portion 331 extending vertically on one side in the peripheral direction, and a second edge portion 332 extending away from the first edge portion 331 as it goes upward on the other side in the peripheral direction.

Next, the outer wall portion 21 of the lighting unit 2 will be described. As shown in FIGS. 5 and 7, the outer wall portion 21 includes a cylindrical main body portion 22, a first extension portion 23 extending upward from the upper end surface of the main body portion 22, and a second extension portion 24 extending upward from the upper surface of the first extension portion 23. A cutout portion 221 having a rectangular cross section is formed in a ring shape on the outer edge of the upper end of the main body portion 22, and the third portion 323 of the lid member 3 fits in the cutout portion 221.

The first extension portion 23 extends upward from the radially inner side of the outer edge of the upper end surface of the main body portion 22. A ring-shaped attachment groove 25 to which the gasket 4 is attached is formed in the lower end portion of the outer peripheral surface of the first extension portion 23. The attachment groove 25 includes a lower surface 252 (second surface) continuous with the upper end surface of the main body portion 22, an upper surface 251 (first surface) facing the lower surface 252 and located above the lower surface 252, and a side surface 253 (third surface) connecting the upper surface 251 and the lower surface 252 to each other and extending in the vertical direction, and the space surrounded by the upper surface 251, the lower surface 252, and the side surface 253 forms the attachment groove 25. In addition, a ring-shaped recess 254 that is recessed radially inward is formed at the lower end portion of the side surface 253. The lower surface of this recess 254 is continuous with the lower surface 252.

A plurality of engagement portions 26 that fit into the recesses 33 formed in the first portion 321 of the lid member 3 are formed on the outer peripheral surface of the second extension portion 24. In this embodiment, four engagement portions 26 are formed, and these engagement portions 26 are formed at a predetermined interval in the peripheral direction. Each engagement portion 26 is formed so as to extend downward from the upper end of the second extension portion 24. Specifically, each engagement portion 26 includes a first edge portion 261 extending downward on one side in the peripheral direction, a second edge portion 262 extending downward on the other side in the peripheral direction, and a lower edge portion 263 that connects the lower end portions of the first edge portion 261 and the second edge portion 262 to each other. The length of the first edge portion 261 is longer than the length of the second edge portion 262, and thus the lower edge portion 263 inclines upward from the first edge portion 261 to the second edge portion 262. In addition, the width in the peripheral direction of each engagement portion 26 is narrower than the width in the peripheral direction of the recess 33 of the lid member 3.

Next, the gasket 4 will be described. As shown in FIG. 8, the gasket 4 has a ring-shaped base portion 41 extending in the up-down direction. Also, three protrusions extending radially outward and inward, namely, a lower protrusion (first protrusion) 42, a middle protrusion (second protrusion) 43, and an upper protrusion (second protrusion) 44 are connected to the base portion 41. The three protrusions 42 to 44 are arranged at a predetermined interval in the vertical direction, and are formed symmetrically inward and outward in the radial direction with the base portion 41 interposed therebetween in cross section. The lower protrusion 42 is formed at the lower end portion of the base portion 41 and forms a flat lower end surface at the lower end portion of the gasket 4 together with the lower end portion of the base portion 41. The lower end surface of the gasket 4 is in contact with the lower surface of the attachment groove 25, and the portion of the lower protrusion 42 extending radially inward fits into the recess 254 of the attachment groove 25. More specifically, the radially inner end portion of the lower protrusion 42 is configured to come into contact with the radially inner far end surface of the recess 254. The middle protrusion 43 and the upper protrusion 44 have the same length in the radial direction, but are shorter than the lower protrusion 42, and their radially inner portions are configured to come into contact with the side surface 253 of the attachment groove 25. Also, the radially outer end portions of these three protrusions 42 to 44 are configured to come into contact with the inner wall surface of the second portion 322 of the lid member 3.

The upper end portion of the base portion 41 protrudes upward from the upper protrusion 44, and the upper end surface thereof is formed flat. The length of the gasket 4 in the vertical direction is slightly shorter than the length of the attachment groove 25 in the vertical direction.

The material constituting the gasket 4 need only be any known material that is employed as a gasket 4, and for example, is made of silicone rubber, nitrile rubber, chloroprene rubber, ethylene propylene rubber, fluororubber, or the like.

The seal structure between the lighting unit 2 and the lid member 3 has been described above, but the same structure is formed in the seal structure between the lighting unit 2 and the base unit 1 as well. That is, the lower end portion of the outer wall portion 21 of the lighting unit 2 protrudes downward, and this lower end portion is configured similarly to the side wall portion 32 of the lid member 3. Also, the upper end portion of the outer wall 11 of the base unit 1 is configured in the same manner as the upper end portion of the outer wall 21 of the lighting unit 2. Also, the gasket 4 is arranged between the lower end portion of the outer wall portion 21 of the lighting unit 2 and the upper end portion of the outer wall portion 11 of the base unit 1 to form a sealing structure.

<3. Attachment and Removal of Cover Member to/from Lighting Unit>

Figure 9:
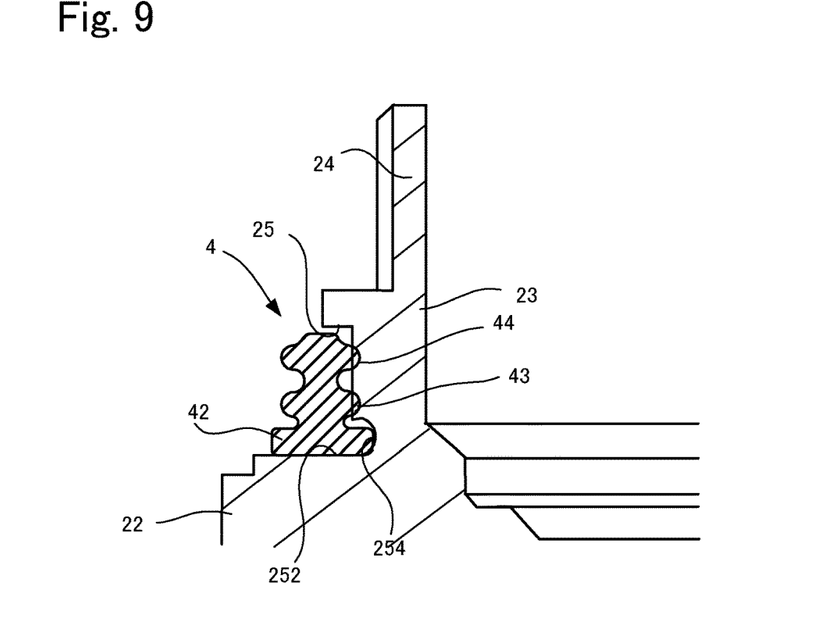
FIG. 9 is a cross-sectional view showing attachment of a lid member.

First, attachment of the cover member to the lighting unit will be described with reference to FIGS. 9 to 12. First, as shown in FIG. 9, the gasket 4 is attached to the attachment groove 25 while being extended, and the lower end surface of the lower protrusion 42 is in contact with the lower surface 252 of the attachment groove 25 and the radially inward portion of the lower protrusion 42 is arranged to fit in the recess 254. At this time, due to the elastic force of the gasket 4, the radially inner end portions of the upper protrusion 44 and the middle protrusion 43 are pressed against the side surface 253 of the attachment groove 25, and the radially inner end portion of the lower protrusion 42 is pressed against the far end surface of the recess 254.

Figure 10:
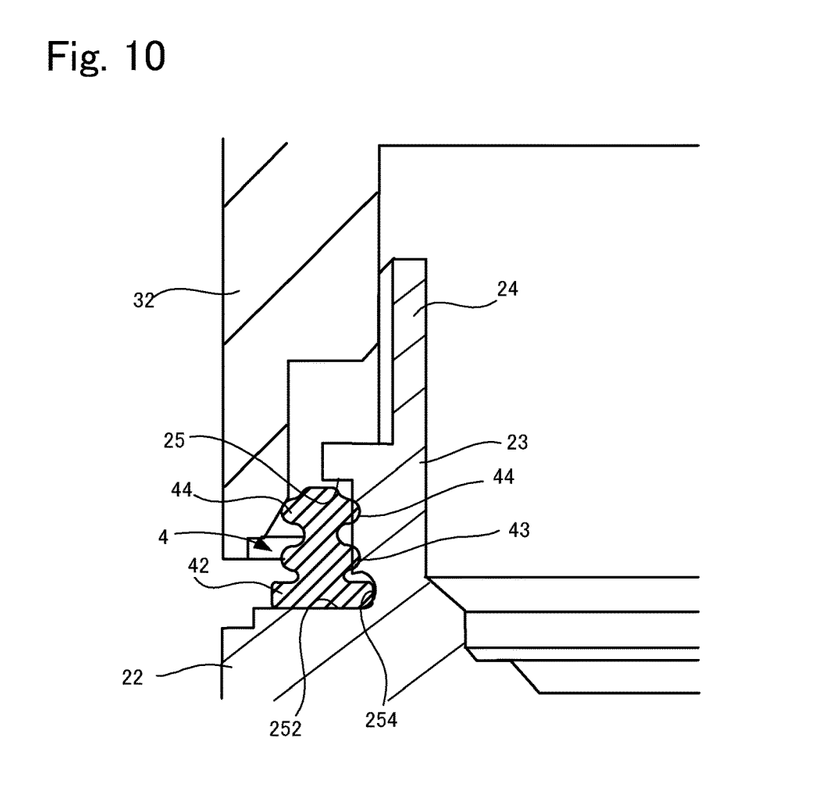
FIG. 10 is a cross-sectional view showing attachment of the lid member.
Figure 11:
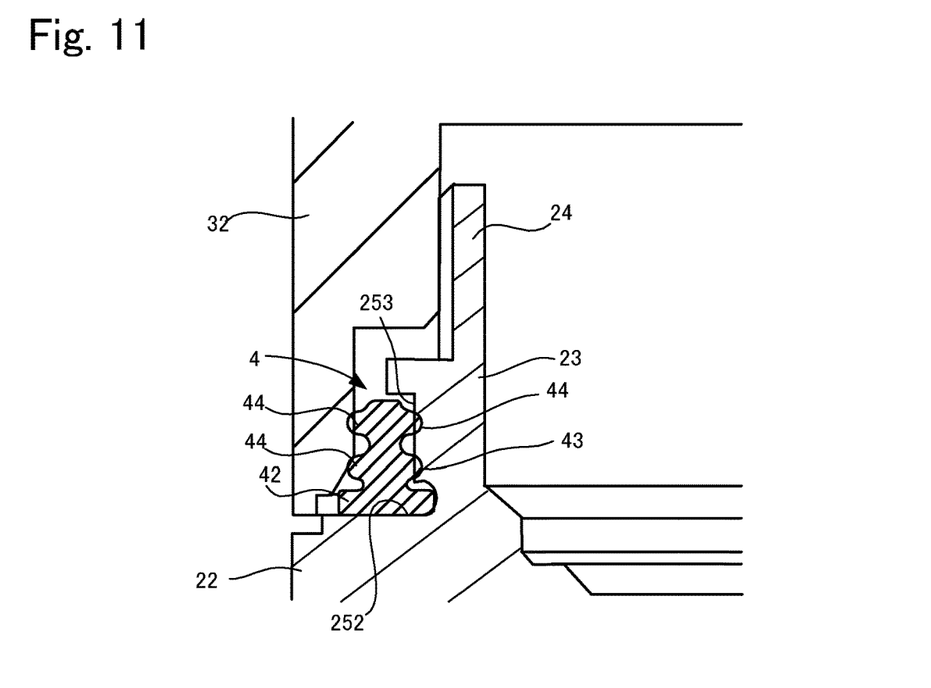
FIG. 11 is a cross-sectional view showing attachment of the lid member.
Figure 12:
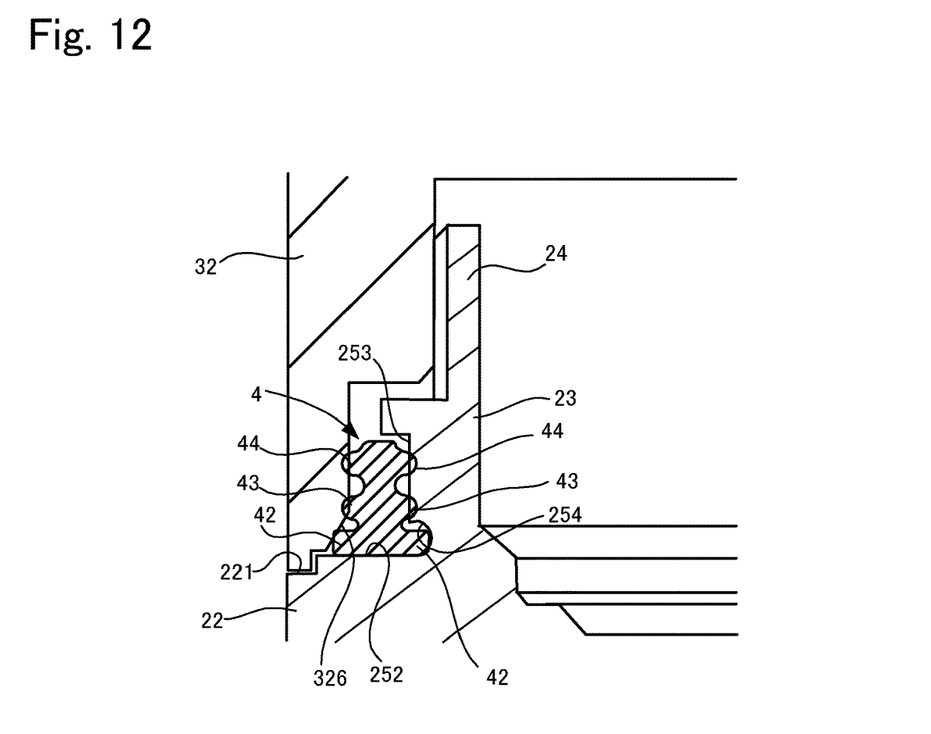
FIG. 12 is a cross-sectional view showing attachment of the lid member.

Next, the lid member 3 is attached to the upper end portion of the lighting unit 2 from above. At this time, alignment is performed such that the positions in the peripheral direction of the recesses 33 of the side wall portion 32 of the lid member 3 and the engagement portions 26 of the lighting unit 2 match each other. Subsequently, the lid member 3 is moved downward toward the lighting unit 2. In this process, as shown in FIGS. 10 to 12, the side wall portion 32 of the lid member 3 comes into contact with the upper protrusion 44, the middle protrusion 43, and the lower protrusion 42, in the stated order. Then, as shown in FIG. 12, when the lower end portion of the side wall portion 32 of the lid member 3, that is, the third portion 323, fits into the cutout portion 221 of the lighting unit 2, the tapered surface 326 comes into contact with the radially outer end portion of the lower protrusion 42. Subsequently, when the lid member 3 is rotated in the peripheral direction, the lower edge portions 263 of the engagement portions 26 move along the second edge portions 332 of the recesses 33 of the lid member 3, and they are engaged with each other. In this manner, the task of attaching the lid member 3 is completed.

Next, removal of the lid member 3 from the lighting unit 2 will be described. First, the lid member 3 is rotated to the opposite side in the peripheral direction relative to the attachment. As a result, the engagement state between the engagement portion 26 of the lighting unit 2 and the recess 33 of the lid member 3 is cancelled. Next, the lid member 3 is moved upward from the lighting unit 2. At this time, first, the contact between the tapered surface 326 and the lower protrusion 42 is cancelled, and when the cover member 3 is moved further upward, the contact with the side wall portion 32 is cancelled in the order of the middle protrusion 43 and the upper protrusion 44. Thus, the lid member 3 is removed from the lighting unit 2.

<4. Features>

According to the signal lamp configured as described above, the following effects can be obtained.

(1) Since the three protrusions 42 to 44 protrude radially inward and outward from the base portion 41, for example, when the protrusions 42 to 44 are pressed from the radially outer side by the side wall 32 of the lid member 3, the force is transmitted in the horizontal direction to the radially inner portion of each of the protrusions 42 to 44, which are pressed against the side surface 253 of the attachment groove 25. Accordingly, force can be exerted uniformly on the radially inner and outer end portions of each of the protrusions 42 to 44. As a result, water-stopping performance can be improved.

(2) The entire outer and inner peripheral surfaces of the gasket 4 are not in contact with the side wall 32 of the lid member 3 and the attachment groove 25 of the lighting unit 2, and only the three protrusions 42 to 44 are in contact therewith. Accordingly, the contact pressure is not distributed, and water can be reliably stopped. Moreover, since the area of contact with the lid member 3 is small, the frictional resistance when attaching and removing the lid member 3 can be reduced. Accordingly, it is possible to reduce the work load at the time of attachment and removal.

(3) Since the lower end surface of the lower protrusion 42 is flat and is in contact with the lower surface 252 of the attachment groove 25, the gasket 4 can be stably held in the attachment groove 25.

(4) In particular, since the length of the lower protrusion 42 in the radial direction is longer than the upper protrusion 44 and the lower protrusion 43, this effect is enhanced. For example, when attaching the lid member 3, when the side wall portion 32 moves downward while in contact with the gasket 4, the gasket 4 can be prevented from being twisted downward or being detached from the attachment groove 25 due to friction with the side wall portion 32. On the other hand, when removing the lid member 3, when the side wall portion 32 moves upward while in contact with the gasket 4, the radially inner portion of the lower protrusion 42 fits in the recess 254 of the attachment groove 25, and therefore it is possible to prevent the gasket 4 from being twisted due to friction with the side wall portion 32 and from being detached from the attachment groove 25 due to being lifted upward.

(5) Since the upper end surface of the base portion 41 of the gasket 4 is flat, when removing the cover member 3, even if the gasket 4 is lifted upward, the upper end surface of the base portion 41 comes into contact with the upper surface 251 of the attachment groove 25, and therefore the gasket 4 can be prevented from being twisted.

<5. Modified Examples>

Although one embodiment of the present invention has been described above, the present invention is not limited to the above-described embodiment, and various modifications are possible without departing from the scope of the invention. It should be noted that the modified examples described below can be combined as appropriate. In addition, the following modifications can also be applied to a later-described second embodiment as appropriate.

<5-1>

In the above embodiment, the gasket 4 is provided with three protrusions 42 to 44, but there is no particular limitation on the number of protrusions 42 to 44, and it is sufficient that at least one protrusion is provided above the lower protrusion 42, in addition to the lower protrusion 42. In addition, there is no particular limitation on the length in the radial direction of each of the protrusions 42 to 44, and the length in the radial direction can be appropriately set according to the shape of the attachment groove 25 and the side wall portion 32, for example. Accordingly, for example, the recess 254 need not be formed on the side surface 253 of the attachment groove 25, and in this case, the length in the radial direction of the lower protrusion 42 can be the same as the length in the radial direction of the other protrusions.

Also, the upper end portion of the base portion 41 need not protrude from the upper protrusion 44, and the uppermost protrusion may have a flat upper surface.

Figure 13:
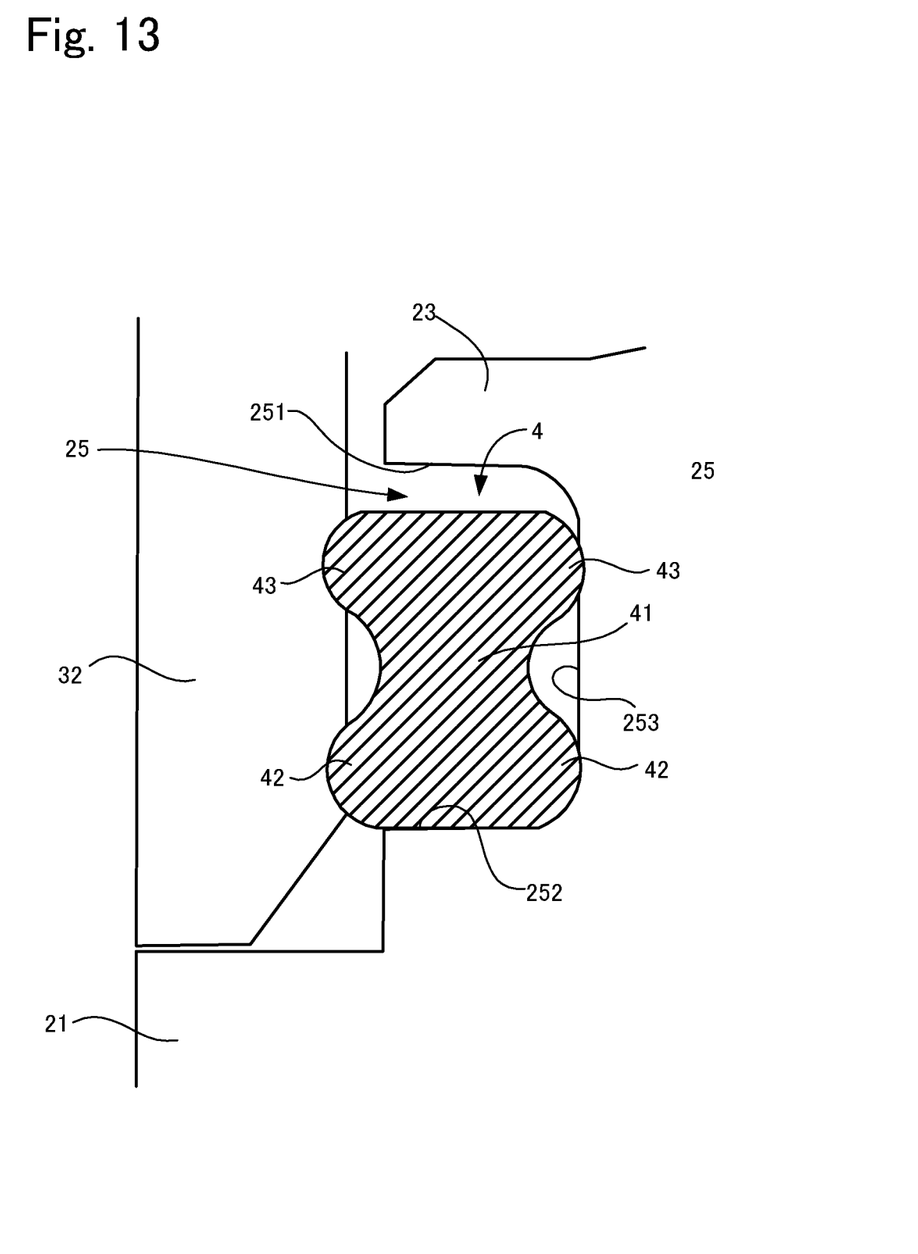
FIG. 13 is another cross-sectional view showing the gasket.

For example, a seal structure using a gasket 4 as shown in FIG. 13 may be used. In the example shown in FIG. 13, the gasket 8 is provided with two protrusions, namely a lower protrusion 42 and an upper protrusion 43. Also, these two protrusions 42 and 43 have the same length in the radial direction. For this reason, the recess 254 shown in the above embodiment is not formed in the attachment groove 25. Also, the upper end of the base portion 41 does not protrude from the upper protrusion 43 and is continuous with the upper surface of the upper protrusion 43. Even if the gasket 4 has such a structure, at least the features (1) to (3) described above can be obtained.

<5-2>

In the above embodiment, when attaching the lid member 3, the lid member 3 is moved downward in the axial direction with respect to the lighting unit 2 and then rotated in the peripheral direction, but the lid member 3 may be attached to the lighting unit 2 simply by being moved in the axial direction. In this case, the recess 33 of the lid member 3 and the engagement portion 26 of the lighting unit 2 need not be provided.

<5-3>

There is no particular limitation on the shape of the side wall portion 32 of the lid member 3, and it is sufficient that it is shaped so as to come into contact with at least the protrusions 42 to 44 of the gasket 4. Similarly, there is no particular limitation on the shape of the extension portions 23 and 24 of the lighting unit 2, and it is sufficient that at least the attachment groove 25 is formed, the protrusions 42 to 44 of the gasket 4 are in contact with the side surface 253, and the lower end surface of the lower protrusion 42 is configured to be in contact with the lower surface 252.

<5-4>

In the above embodiment, seal structures are formed between the lid member 3 and the lighting unit 2 and between the lighting unit 2 and the base unit 1, but the seal structures need not be identical, as long as they are formed as described in <5-1> and <5-3> above, for example. Also, the seal structure may be formed only between the cover member 3 and the lighting unit 2 or between the lighting unit 2 and the base unit 1, and a seal structure other than that of the present invention may be formed on the other.

<5-5>

Although one lighting unit 2 and one base unit 1 are provided in the above embodiment, the number of these units is not particularly limited. For example, multiple lighting units 2 can also be stacked. In this case, the above-described seal structure can be provided between adjacent stacked units.

<5-6>

In the above embodiments, the electronic device of the present invention was applied to a signal lamp, but the above-described seal structure can be provided between a stacked body having at least one stacked unit, and a lid member attached to one stacked body, or the above-described seal structure can be provided between adjacent stacked units in a stacked body having a plurality of stacked units. In this case, the stacked units can accommodate, for example, various electronic devices that require water-stopping performance, such as a sound source such as a speaker, a communication device such as a wireless device, and a sensor, instead of a light source for lighting.

LIST OF REFERENCE NUMERALS

1 Base unit (stacked unit)
2 Lighting unit (stacked unit)
25 Attachment groove
3 Lid member
31 Top wall portion
32 Side wall portion
4 Gasket
41 Base portion
42 Lower protrusion (first protrusion)
43 Middle protrusion (second protrusion)
44 Upper protrusion (second protrusion)

The invention claimed is:

1. An electronic device comprising:
a stacked body including at least one columnar stacked unit that is stacked in a first direction and accommodates an electronic component;
a lid member attached to an end-portion stacked unit provided at an end portion in the first direction of the stacked unit, and having a top wall portion and a side wall portion extending from a peripheral edge of the top wall portion; and
a ring-shaped gasket attached between the end-portion stacked unit and the lid member,
wherein a ring-shaped attachment groove for accommodating the gasket is formed on an outer peripheral surface of the end-portion stacked unit,
the attachment groove has a first surface on the lid member side in the first direction, a second surface on a side opposite to the first surface in the first direction, and a third surface extending along the first direction and connecting the first surface and the second surface,
the gasket includes:
    a base portion extending in the first direction and having a first end portion and a second end portion;
    a ring-shaped first protrusion extending radially inward and outward at the first end portion of the base portion on the end-portion stacked unit side in the first direction; and
    at least one ring-shaped second protrusion extending radially inward and outward on the lid member side of the base portion in the first direction relative to the first protrusion,
radially inner and outer end portions of the first protrusion and the second protrusion are configured to come into contact with the third surface and the side wall, respectively, and
at least part of the first protrusion and the first end portion of the base portion is configured to come into contact with the second surface of the attachment groove.

2. An electronic device comprising:
a stacked body having two or more columnar stacked units stacked in a first direction and accommodating electronic components; and
a gasket provided between the stacked units adjacent in the first direction,
wherein the two or more stacked units adjacent in the first direction include at least a first stacked unit arranged on one side in the first direction and a second stacked unit arranged on the other side in the first direction,
a ring-shaped side wall portion extending from an end portion in an axial direction of the second stacked unit toward the first stacked unit is provided,
a ring-shaped attachment groove for accommodating the gasket is formed on an outer peripheral surface of the first stacked unit,
the attachment groove has a first surface on the second stacked unit side in the first direction, a second surface on a side opposite to the first surface in the first direction, and a third surface extending along the first direction and connecting the first surface and the second surface,
the gasket includes:
    a base portion extending in the first direction and having a first end portion and a second end portion;
    a ring-shaped first protrusion extending radially inward and outward at the first end portion of the base portion on the stacked unit side in the first direction; and
    at least one ring-shaped second protrusion extending radially inward and outward on the second end portion side of the base portion with respect to the first protrusion,
radially inner and outer end portions of the first protrusion and the second protrusion are configured to come into contact with the third surface and the side wall, respectively, and
at least part of the first protrusion and the first end portion of the base portion is configured to come into contact with the second surface of the attachment groove.

3. The electronic device according to claim 2,
wherein the length of the first protrusion in the radial direction is longer than the length of the second protrusion in the radial direction, and
a ring-shaped recess that accommodates the first protrusion of the gasket and extends radially inward is formed on the third surface of the attachment groove.

4. The electronic device according to claim 2, wherein two or more of the second protrusions are formed at a predetermined interval in the first direction.

5. The electronic device according to claim 2, wherein a flat surface capable of coming into contact with the second surface of the attachment groove is formed on the second end portion of the base portion.

6. A gasket having the same configuration as the gasket attached to the electronic device according to claim 2.

* * * * *